United States Patent
Tsung

(10) Patent No.: US 11,677,359 B2
(45) Date of Patent: Jun. 13, 2023

(54) CIRCUIT WHICH REUSES CURRENT TO SYNTHESIZE NEGATIVE IMPEDANCE

(71) Applicant: Realtek Semiconductor Corp., HsinChu (TW)

(72) Inventor: Kuan-Chang Tsung, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/505,607

(22) Filed: Oct. 19, 2021

(65) Prior Publication Data

US 2023/0015034 A1 Jan. 19, 2023

(30) Foreign Application Priority Data

Jul. 15, 2021 (TW) ................. 110126021

(51) Int. Cl.
*H03F 3/45* (2006.01)
*H03F 3/04* (2006.01)

(52) U.S. Cl.
CPC ........... *H03F 3/04* (2013.01); *H03F 3/45179* (2013.01); *H03F 3/45183* (2013.01); *H03F 2200/369* (2013.01)

(58) Field of Classification Search
CPC .. H03F 3/04; H03F 2200/369; H03F 3/45183; H03F 3/45179; H03F 3/45192; H03F 3/45089; H03F 3/45
USPC .................................................. 330/252, 253
See application file for complete search history.

(56) References Cited

U.S. PATENT DOCUMENTS

| | | | | |
|---|---|---|---|---|
| 7,495,510 B2* | 2/2009 | Kamakura | .......... | H03F 3/45183 330/253 |
| 7,633,341 B2* | 12/2009 | Bagheri | .............. | H03F 3/45475 330/253 |
| 7,961,050 B1* | 6/2011 | Swei | .................... | H03F 3/45183 330/254 |
| 8,872,587 B2* | 10/2014 | Cheeranthodi | ..... | H03F 3/45179 330/252 |
| 9,583,175 B1 | 2/2017 | Singh et al. | | |
| 2006/0261902 A1 | 11/2006 | Masuda | | |
| 2008/0042747 A1 | 2/2008 | Kamakura | | |

(Continued)

OTHER PUBLICATIONS

Razavi, The Cross-Coupled Pair Part III, IEEE Solid-State Circuits Magazine, Feb. 9, 2015, 10-13, 7(1), IEEE, USA.

*Primary Examiner* — Khanh V Nguyen
(74) *Attorney, Agent, or Firm* — Winston Hsu

(57) ABSTRACT

A circuit which reuses current to synthesize a negative impedance includes a current source circuit, a differential circuit, and a negative impedance conversion circuit. The current source circuit is arranged to provide at least one predetermined current, wherein the current source circuit has a first connection port and a second connection port, and the first connection port of the current source is coupled to a first reference voltage. The differential circuit is coupled between the second connection port of the current source circuit and a second reference voltage, and is arranged to receive a differential input pair and generate a differential output pair, wherein the differential circuit has a differential output port. The negative impedance conversion circuit is coupled between the differential output port and a third reference voltage, wherein the third reference voltage is different from the first reference voltage.

9 Claims, 7 Drawing Sheets

(56) References Cited

U.S. PATENT DOCUMENTS

2014/0306737 A1* 10/2014 Mukherjee .......... H03F 3/45506
                                                         327/108
2020/0119956 A1*  4/2020 Sun .................... H04B 3/18
2020/0412345 A1* 12/2020 Bajoria ............... H03F 3/45183

* cited by examiner

US 11,677,359 B2

CIRCUIT WHICH REUSES CURRENT TO SYNTHESIZE NEGATIVE IMPEDANCE

BACKGROUND OF THE INVENTION

1. Field of the Invention

The present invention is related to technology for synthesizing a negative impedance, and more particularly, to a circuit which reuses current to synthesize the negative impedance.

2. Description of the Prior Art

In an amplifier circuit, an equivalent input capacitance value of parasitic capacitances that are between an input terminal and an output terminal will be enlarged due to the Miller effect. These parasitic capacitances will not only affect stability of the amplifier circuit, but also limit operating bandwidth of the amplifier circuit. As a result, a negative impedance conversion circuit is usually coupled to the output terminal of the amplifier circuit (e.g. a negative impedance synthesis circuit including an amplifier circuit and a negative impedance conversion circuit), to compensate for the parasitic capacitance and improve the operating bandwidth of the amplifier circuit.

Typically, a negative impedance conversion circuit includes two cross-coupled transistors and a fixed capacitor, where one terminal of the negative impedance conversion circuit is connected in parallel to the output terminal of the amplifier circuit, and another terminal of the negative impedance conversion circuit is connected to ground. Due to the negative capacitance effect, an equivalent output impedance of the fixed capacitor may compensate for the parasitic capacitances, and a higher bandwidth may thereby be obtained. Current negative impedance synthesis circuits have a fatal flaw, however. They require additional current consumption, resulting in high power consumption and high cost. As a result, a novel negative impedance synthesis circuit is urgently needed to address this problem.

SUMMARY OF THE INVENTION

It is therefore one of the objectives of the present invention to provide a circuit for reusing current to synthesize a negative impedance, to address the above-mentioned problems.

At least one embodiment of the present invention provides a negative impedance synthesis circuit, wherein the negative impedance synthesis circuit reuses current to synthesize the negative impedance. The negative impedance synthesis circuit may include a current source circuit, a differential circuit, and a negative impedance conversion circuit. The current source circuit may be arranged to provide at least one predetermined current, wherein the current source circuit has a first connection port and a second connection port, and the first connection port of the current source circuit is coupled to a first reference voltage. The differential circuit may be coupled between the second connection port of the current source circuit and a second reference voltage, and may be arranged to receive a differential input pair and generate a differential output pair, wherein the differential circuit has a differential output port for outputting the differential output pair. The negative impedance conversion circuit may be coupled between the differential output port and a third reference voltage, wherein the third reference voltage is different from the first reference voltage.

One of the benefits of the present invention is that, by connecting the negative impedance conversion circuit in parallel to the differential output port of the differential circuit, the negative impedance conversion circuit may achieve the negative capacitance effect by using partial current of the differential circuit. As a result, there is no need to consume additional current, thereby not only increasing the bandwidth of the negative impedance synthesis circuit, but also reducing power consumption and associated costs of the negative impedance synthesis circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
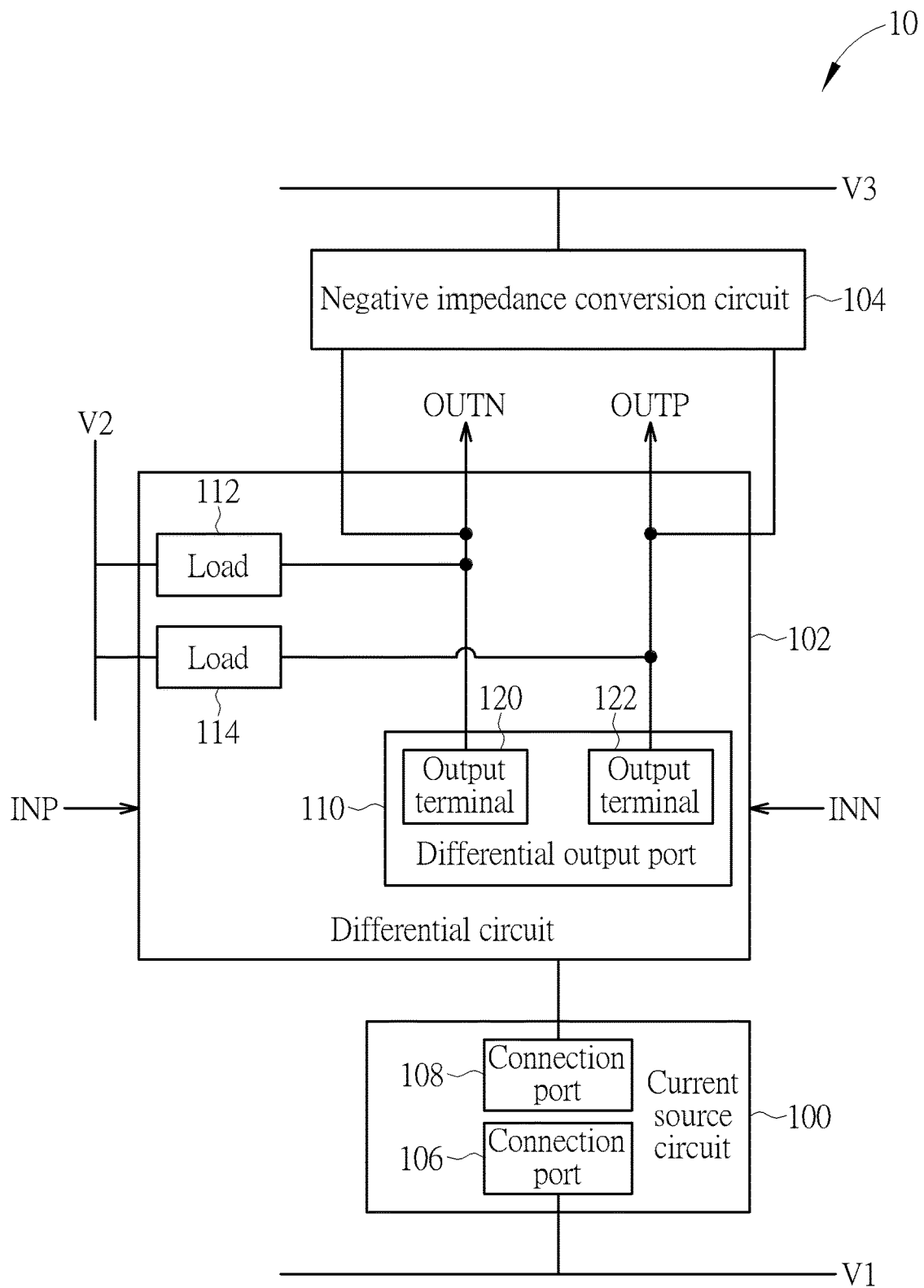
FIG. 1 is a block diagram of a negative impedance synthesis circuit according to an embodiment of the present invention.

FIG. 1 is a block diagram of a negative impedance synthesis circuit 10 according to an embodiment of the present invention. The negative impedance synthesis circuit 10 may include a current source circuit 100, a differential circuit 102, and a negative impedance conversion circuit 104. The current source circuit 100 may be arranged to provide at least one predetermined current (i.e. the current source circuit 100 may include one or more current sources according to design requirement), and may include a plurality of connection ports 106 and 108, wherein the connection port 106 may be coupled to a reference voltage V1. The differential circuit 102 may be coupled between the connection port 108 of the current source circuit 100 and a reference voltage V2, and may be arranged to receive a differential input pair (i.e. differential input voltages INN and INP) and generate a differential output pair (i.e. differential output voltages OUTN and OUTP), wherein the reference voltage V2 is higher than the reference voltage V1.

In addition, the differential circuit 102 has a differential output port 110, wherein the differential output port 110 may include a plurality of output terminals 120 and 122, and the plurality of output terminals 120 and 122 are arranged to output the differential output pair (e.g. output the differential output voltages OUTN and OUTP, respectively). The negative impedance conversion circuit 104 may be coupled between the output terminal 120, the output terminal 122, and a reference voltage V3, wherein the reference voltage V3 is different from the reference voltage V2 (e.g. the reference voltage V3 is higher than the reference voltages V1 and V2). Additionally, the differential circuit 102 further includes a plurality of loads 112 and 114, wherein the load 112 may be coupled between the output terminal 120 and the reference voltage V2, the load 114 may be coupled between the output terminal 122 and the reference voltage V2, the negative impedance conversion circuit 104 and the load 112 are connected in parallel to the output terminal 120, and the negative impedance conversion circuit 104 and the load 114 are connected in parallel to the output terminal 122.

As shown in FIG. 1, the differential circuit 102 and the negative impedance conversion circuit 104 may share the predetermined current provided by the current source circuit 100. As a result, when the negative impedance conversion circuit 104 achieves the negative capacitance effect, the negative impedance conversion circuit 104 only needs to consume a portion of the predetermined current, without consuming any additional current. In this way, the bandwidth of the negative impedance synthesis circuit 10 may be increased, and the power consumption and cost of the impedance synthesis circuit 10 may be reduced.

Figure 2:
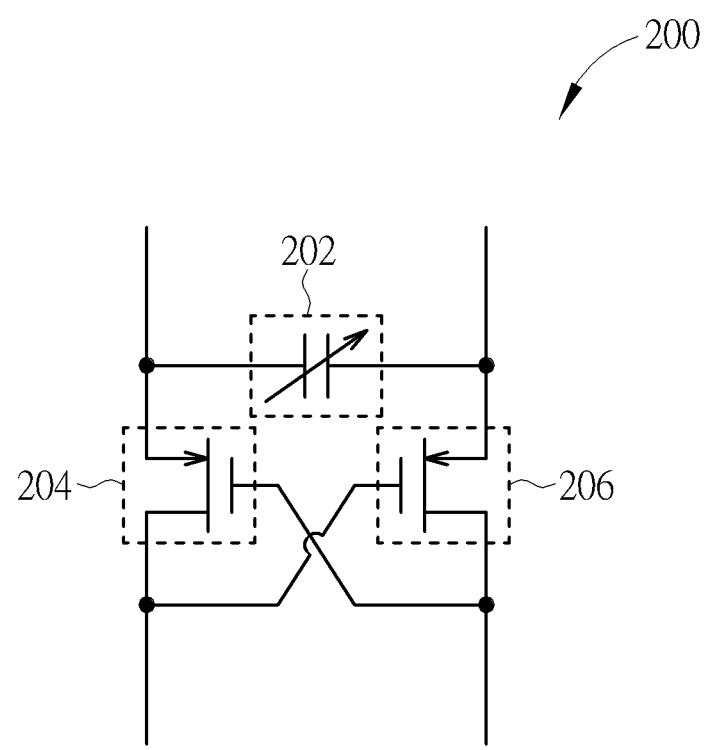
FIG. 2 is a diagram illustrating a negative impedance conversion circuit according to an embodiment of the present invention.

FIG. 2 is a diagram illustrating a negative impedance conversion circuit 200 according to an embodiment of the present invention, wherein the negative impedance conversion circuit 104 shown in FIG. 1 may be implemented by the negative impedance conversion circuit 200 shown in FIG. 2. The negative impedance conversion circuit 200 may include a variable capacitor 202 and a plurality of P-type Metal-Oxide-Semiconductor Field-Effect Transistors (MOSFETs) (for brevity, referred to as "transistor") 204 and 206, wherein a gate terminal of the P-type transistor 204 may be coupled to a drain terminal of the P-type transistor 206, a gate terminal of the P-type transistor 206 may be coupled to a drain terminal of the P-type transistor 204 (i.e. the P-type transistors 204 and 206 are cross-coupled), and the variable capacitor 202 may be coupled between a source terminal of the P-type transistor 204 and a source terminal of the P-type transistor 206. In addition, the frequency response of the negative impedance synthesis circuit 10 at high frequencies may be fine-tuned by adjusting a capacitance value of the variable capacitor 202.

Figure 3:
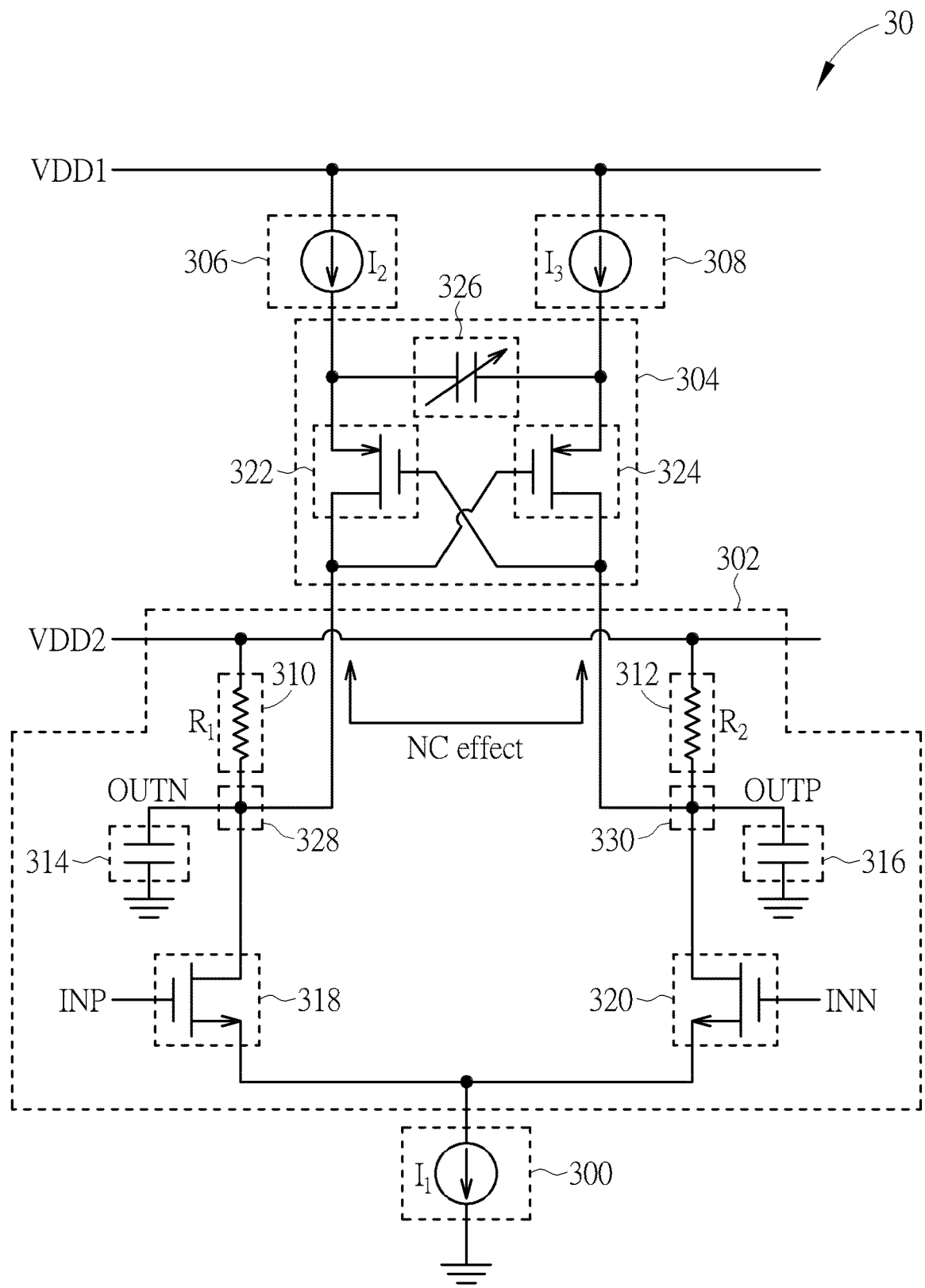
FIG. 3 is a diagram illustrating the negative impedance synthesis circuit shown in FIG. 1 according to an embodiment of the present invention.

FIG. 3 is a diagram illustrating the negative impedance synthesis circuit shown in FIG. 1 according to an embodiment of the present invention. The negative impedance synthesis circuit 10 shown in FIG. 1 may be implemented by a negative impedance synthesis circuit 30 shown in FIG. 3 (i.e. the negative impedance synthesis circuit 30 also uses the architecture shown in FIG. 1). The negative impedance synthesis circuit 30 may include a current source 300, a current mode logic (CML) amplifier 302, and a negative impedance conversion circuit 304, wherein the current source 300 is arranged to realize the current source circuit 100 shown in FIG. 1, the CML amplifier 302 is arranged to realize the differential circuit 102 shown in FIG. 1, and the negative impedance conversion circuit 304 is arranged to realize the negative impedance conversion circuit 104 shown in FIG. 1.

In this embodiment, a terminal of the current source 300 (e.g. the current source circuit 100 shown in FIG. 1) may be connected to ground (e.g. the reference voltage V1 shown in FIG. 1 is equal to 0), another terminal of the current source 300 may be coupled to the CML amplifier 302 (e.g. the differential circuit 102 shown in FIG. 1), and the current source 300 may be arranged to provide a predetermined current $I_1$. The CML amplifier 302 may be coupled between the current source 300 and a power voltage VDD2 (e.g. the reference voltage V2 shown in FIG. 1), and may be arranged to receive a differential input pair (i.e. the differential input voltages INN and INP) and output a differential output pair (i.e. the differential output voltages OUTN and OUTP).

In addition, the CML amplifier 302 may include a plurality of parasitic capacitances 314 and 316, a plurality of N-type transistors 318 and 320, and a plurality of output terminals 328 and 330 (e.g. the output terminals 120 and 122 shown in FIG. 1), wherein the parasitic capacitance 314 may be located between the output terminal 328 and ground, the parasitic capacitance 316 may be located between the output terminal 330 and ground, the N-type transistor 318 may be coupled between the output terminal 328 and the current source 300, the N-type transistor 320 may be coupled between the output terminal 330 and the current source 300, and the output terminals 328 and 330 may be arranged to output the differential output pair (e.g. output the differential output voltages OUTN and OUTP, respectively).

The negative impedance conversion circuit 304 may be coupled between the output terminal 328, the output terminal 330, and a power voltage VDD1 (e.g. the reference voltage V3 shown in FIG. 1), and may include a plurality of P-type transistors 322 and 324 and a variable capacitor 326, wherein a drain terminal of the P-type transistor 322 may be coupled to the output terminal 328, a gate terminal of the P-type transistor 322 may be coupled to the output terminal 330, a drain terminal of the P-type transistor 324 may be coupled to the output terminal 330, a gate terminal of the P-type transistor 324 may be coupled to the output terminal 328 (i.e. the P-type transistors 322 and 324 are cross-coupled, which may be implemented by the negative impedance conversion circuit 200 shown in FIG. 2), the variable capacitor 326 may be coupled between a source terminal of the P-type transistor 322 and a source terminal of the P-type transistor 324, and the power voltage VDD1 is higher than the power voltage VDD2. The CML amplifier 302 may further include a plurality of resistors 310 and 312 (e.g. the loads 112 and 114 shown in FIG. 1), wherein the resistor 310 may be coupled between the output terminal 328 and the power voltage VDD2, the resistor 312 may be coupled between the output terminal 330 and the power voltage VDD2, the negative impedance conversion circuit 304 and the resistor 310 may be connected in parallel to the output terminal 328, and the negative impedance conversion circuit 304 and the resistor 312 may be connected in parallel to the output terminal 330.

It should be noted that the resistors 310 and 312 (e.g. the loads 112 and 114 shown in FIG. 1) of the CML amplifier 302 may be replaced with passive inductors, active inductors, or a combination of inductors and resistors coupled in series, coupled in parallel, or a combination of series and parallel. The representation of the loads with resistors is only for illustrative purposes; the present invention is not limited thereto. In addition, there are a plurality of current sources 306 and 308 between the negative impedance conversion circuit 304 and the power voltage VDD1, for providing a current $I_2$ flowing through the P-type transistor 322 and a current $I_3$ flowing through the P-type transistor 324, respectively.

As shown in FIG. 3, the CML amplifier 302 and the negative impedance conversion circuit 304 may share the current source 300 (i.e. share the predetermined current $I_1$ provided by the current source 300). That is, the current $I_2$ and the current $I_3$ are a portion of the predetermined current $I_1$. As a result, when the negative impedance conversion circuit 304 achieves the negative capacitance effect (for brevity, labeled as "NC effect" in FIG. 3) by an equivalent impedance of the variable capacitor 326 at the output terminals 328 and 330, to compensate for the parasitic capacitances 314 and 316, the negative impedance conversion circuit 304 only needs to consume the portion of the predetermined current $I_1$ (i.e. the current $I_2$ and the current $I_3$), without consuming any additional current. In this way, the bandwidth of the negative impedance synthesis circuit 30 may be increased, and the power consumption and cost of the negative impedance synthesis circuit 30 may be reduced. In addition, a capacitance value of the variable capacitor 326 may be adjusted to fine-tune the frequency response of the negative impedance synthesis circuit 10 at high frequencies.

Figure 4:
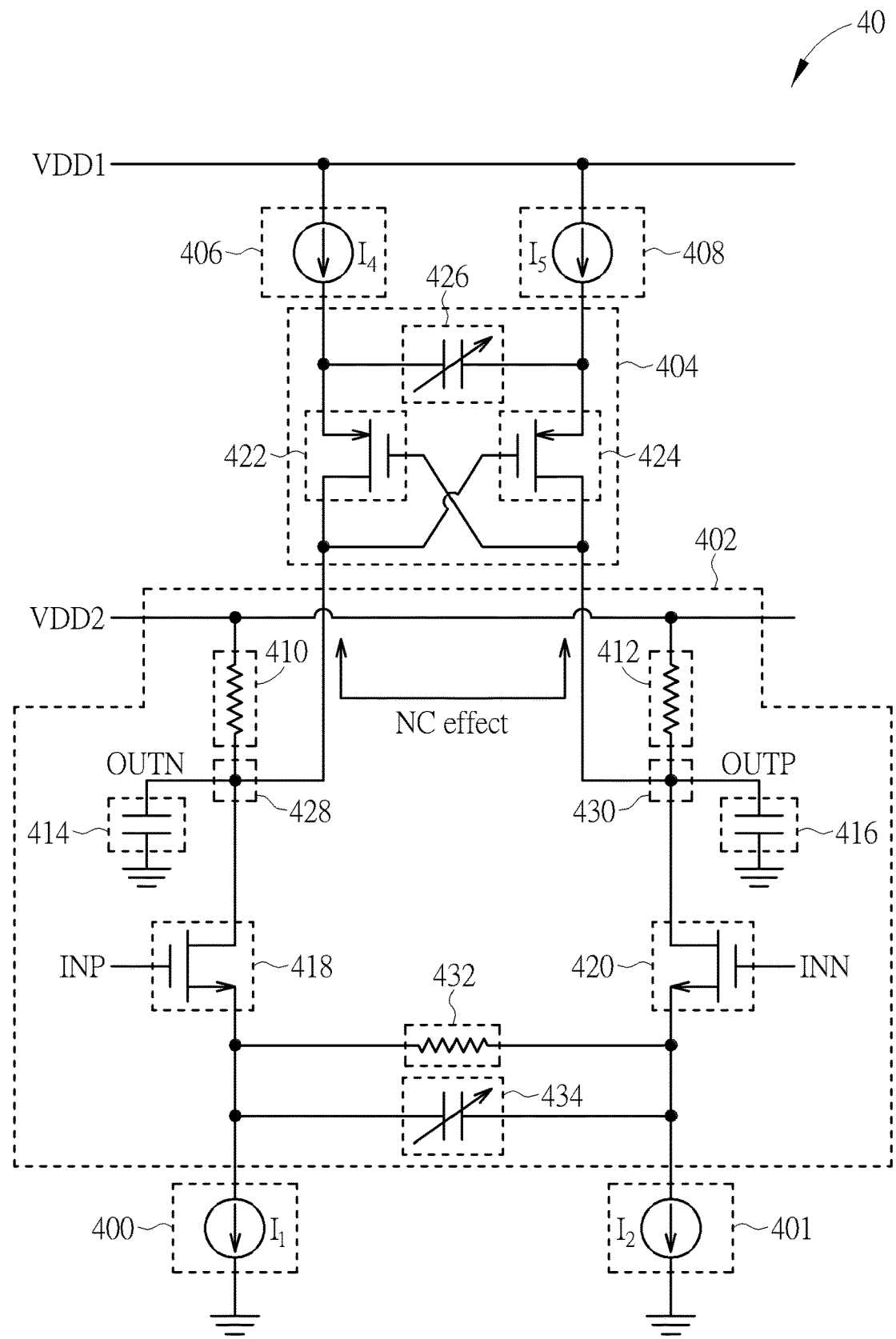
FIG. 4 is a diagram illustrating the negative impedance synthesis circuit shown in FIG. 1 according to another embodiment of the present invention.

FIG. 4 is a diagram illustrating the negative impedance synthesis circuit 10 shown in FIG. 1 according to another embodiment of the present invention. The negative impedance synthesis circuit 10 shown in FIG. 1 may be implemented by a negative impedance synthesis circuit 40 shown in FIG. 4 (i.e. the negative impedance synthesis circuit 40 also uses the architecture shown in FIG. 1). As shown in FIG. 4, the negative impedance synthesis circuit 40 may include a plurality of current sources 400 and 401, a continuous time linear equalizer (CTLE) 402, and a negative impedance conversion circuit 404, wherein the current sources 400 and 401 are arranged to realize the current source circuit 100 shown in FIG. 1, the CTLE 402 is arranged to realize the differential circuit 102 shown in FIG. 1, and the negative impedance conversion circuit 404 is arranged to realize the negative impedance conversion circuit 104 shown in FIG. 1.

In this embodiment, a terminal of the current source 400 and a terminal of the current source 401 (e.g. the current source circuit 100 shown in FIG. 1) may be connected to ground (e.g. the reference voltage V1 shown in FIG. 1 is equal to 0), another terminal of the current source 400 and another terminal of the current source 401 may be coupled to the CTLE 402 (e.g. the differential circuit 102 shown in FIG. 1), and the current sources 400 and 401 may be arranged to provide a plurality of predetermined currents $I_1$ and $I_2$ to the negative impedance synthesis circuit 40, wherein a sum of the predetermined currents $I_1$ and $I_2$ is $I_3$ (i.e. $I_3=I_1+I_2$). The CTLE 402 may be coupled between the current sources 400 and 401 and a power voltage VDD2 (e.g. the reference voltage V2 shown in FIG. 1), and may be arranged to receive a differential input pair (i.e. the differential input voltages INN and INP) and output a differential output pair (i.e. the differential output voltages OUTN and OUTP).

In addition, the CTLE 402 may include a plurality of parasitic capacitances 414 and 416, a plurality of N-type transistors 418 and 420, a plurality of output terminals 428 and 430 (e.g. the output terminals 120 and 122 shown in FIG. 1), a resistor 432, and a variable capacitor 434, wherein the parasitic capacitance 414 may be located between the output terminal 428 and ground, the parasitic capacitance 416 may be located between the output terminal 430 and ground, the N-type transistor 418 may be coupled between the output terminal 428 and the current source 400, the N-type transistor 420 may be coupled between the output terminal 430 and the current source 401, the output terminals 428 and 430 may be arranged to output the differential output pair (e.g. output the differential output voltages OUTN and OUTP, respectively), the resistor 432 may be coupled between a source terminal of the N-type transistor 418 and a source terminal of the N-type transistor 420, and the variable capacitor 432 may be coupled between the resistor 432 and the current sources 400 and 401.

The negative impedance conversion circuit 404 may be coupled between the output terminal 428, the output terminal 430, and a power voltage VDD1 (e.g. the reference voltage V3 shown in FIG. 1), and may include a plurality of P-type transistors 422 and 424 and a variable capacitor 426, wherein a drain terminal of the P-type transistor 422 may be coupled to the output terminal 428, a gate terminal of the P-type transistor 422 may be coupled to the output terminal 430, a drain terminal of the P-type transistor 424 may be coupled to the output terminal 430, a gate terminal of the P-type transistor 424 may be coupled to the output terminal 428 (i.e. the P-type transistors 422 and 424 are cross-coupled, which may be implemented by the negative impedance conversion circuit 200 shown in FIG. 2), the variable capacitor 426 may be coupled between a source terminal of the P-type transistor 422 and a source terminal of the P-type transistor 424, and the power voltage VDD1 is higher than the power voltage VDD2. The CTLE 402 may further include a plurality of resistors 410 and 412 (e.g. the loads 112 and 114 shown in FIG. 1), wherein the resistor 410 may be coupled between the output terminal 428 and the power voltage VDD2, the resistor 412 may be coupled between the output terminal 430 and the power voltage VDD2, the negative impedance conversion circuit 404 and the resistor 410 may be connected in parallel to the output terminal 428, and the negative impedance conversion circuit 404 and the resistor 412 may be connected in parallel to the output terminal 430.

It should be noted that the resistors 410 and 412 (e.g. the loads 112 and 114 shown in FIG. 1) of the CTLE 402 may be replaced with passive inductors, active inductors, or a plurality of inductors and resistors coupled in series, coupled in parallel, or a combination of series and parallel. The representation of the loads with resistors is only for illustrative purposes; the present invention is not limited thereto. In addition, there are a plurality of current sources 406 and 408 between the negative impedance conversion circuit 404 and the power voltage VDD1, for providing a current $I_4$ flowing through the P-type transistor 422 and a current $I_5$ flowing through the P-type transistor 424, respectively.

As shown in FIG. 4, the CTLE 402 and the negative impedance conversion circuit 404 may share the current sources 400 and 401 (i.e. share the predetermined current $I_3$ provided by the current sources 400 and 401). That is, the current $I_4$ and the current $I_5$ are a portion of the predetermined current $I_3$. As a result, when the negative impedance conversion circuit 404 achieves the negative capacitance effect (for brevity, labeled as "NC effect" in FIG. 4) by an equivalent impedance of the variable capacitor 426 at the output terminals 428 and 430, to compensate for the parasitic capacitances 414 and 416, the negative impedance conversion circuit 404 only needs to consume the portion of the predetermined current $I_3$ (i.e. the current $I_4$ and the current $I_5$), without consuming any additional current. In this way, the bandwidth of the negative impedance synthesis circuit 40 may be increased, and the power consumption and the cost of the negative impedance synthesis circuit 40 may be reduced. In addition, a capacitance value of the variable capacitor 426 may be adjusted to fine-tune the frequency response of the negative impedance synthesis circuit 40 at high frequencies.

Please note that the circuits shown in FIG. 3 and FIG. 4 are for illustrative purposes only, and the present invention is not limited thereto. In practice, any negative impedance synthesis circuit that is realized based on the architecture shown in FIG. 1 will fall within the scope of the present invention.

If the voltage value of the reference voltage V3 of the negative impedance synthesis circuit 10 shown in FIG. 1 is high enough, there is no need to additionally provide the reference voltage V2 different from the reference voltage V3. In addition, the loads 112 and 114 may be coupled to the reference voltage V3 (i.e. the reference voltage V2 is equal to the reference voltage V3), respectively, and the circuit for reusing current to synthesize the negative impedance may also be realized in this way.

Figure 5:
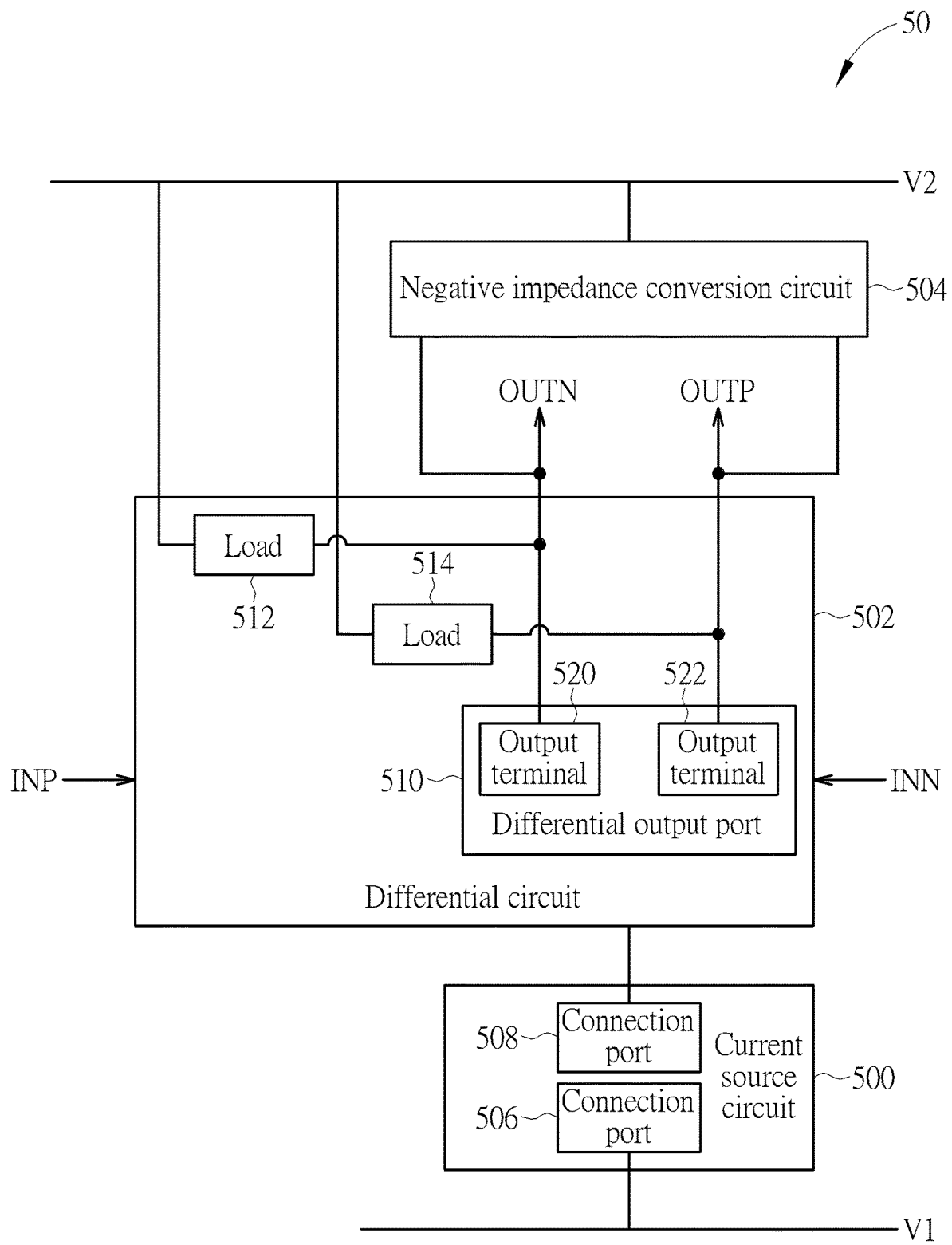
FIG. 5 is a block diagram of a negative impedance synthesis circuit according to another embodiment of the present invention.

FIG. 5 is a block diagram of a negative impedance synthesis circuit 50 according to another embodiment of the present invention. The negative impedance synthesis circuit 50 may include a current source circuit 500, a differential circuit 502, and a negative impedance conversion circuit 504 (which may be implemented by the negative impedance circuit 200 shown in FIG. 2). The current source circuit 500 may be arranged to provide at least one predetermined current, and may include a plurality of connection ports 506 and 508, wherein the connection port 506 may be coupled to a reference voltage V1. The differential circuit 502 may be coupled between the connection port 508 of the current source circuit 500 and a reference voltage V2, and may be arranged to receive a differential input pair (i.e. differential input voltages INN and INP) and generate a differential output pair (i.e. differential output voltages OUTN and OUTP), wherein the reference voltage V2 is higher than the reference voltage V1.

In addition, the differential circuit 502 has a differential output port 510, wherein the differential output port 510 may include a plurality of output terminals 520 and 522, and the plurality of output terminals 520 and 522 are arranged to output the differential output pair (e.g. output the differential output voltages OUTN and OUTP, respectively). The negative impedance conversion circuit 504 may be coupled between the output terminals 520 and 522 and the reference voltage V2. Additionally, the differential circuit 502 further includes a plurality of loads 512 and 514, wherein the load 512 may be coupled between the output terminal 520 and the reference voltage V2, the load 514 may be coupled between the output terminal 522 and the reference voltage V2, the negative impedance conversion circuit 504 and the load 512 are connected in parallel to the output terminal 520, and the negative impedance conversion circuit 504 and the load 514 are connected in parallel to the output terminal 522.

As shown in FIG. 5, the differential circuit 502 and the negative impedance conversion circuit 504 may share the predetermined current provided by the current source circuit 500. As a result, when the negative impedance conversion circuit 504 achieves the negative capacitance effect, the negative impedance conversion circuit 504 only needs to consume a portion of the predetermined current, without consuming any additional current. In this way, the bandwidth of the negative impedance synthesis circuit 50 may be increased, and the power consumption and cost of the impedance synthesis circuit 50 may be reduced.

Figure 6:
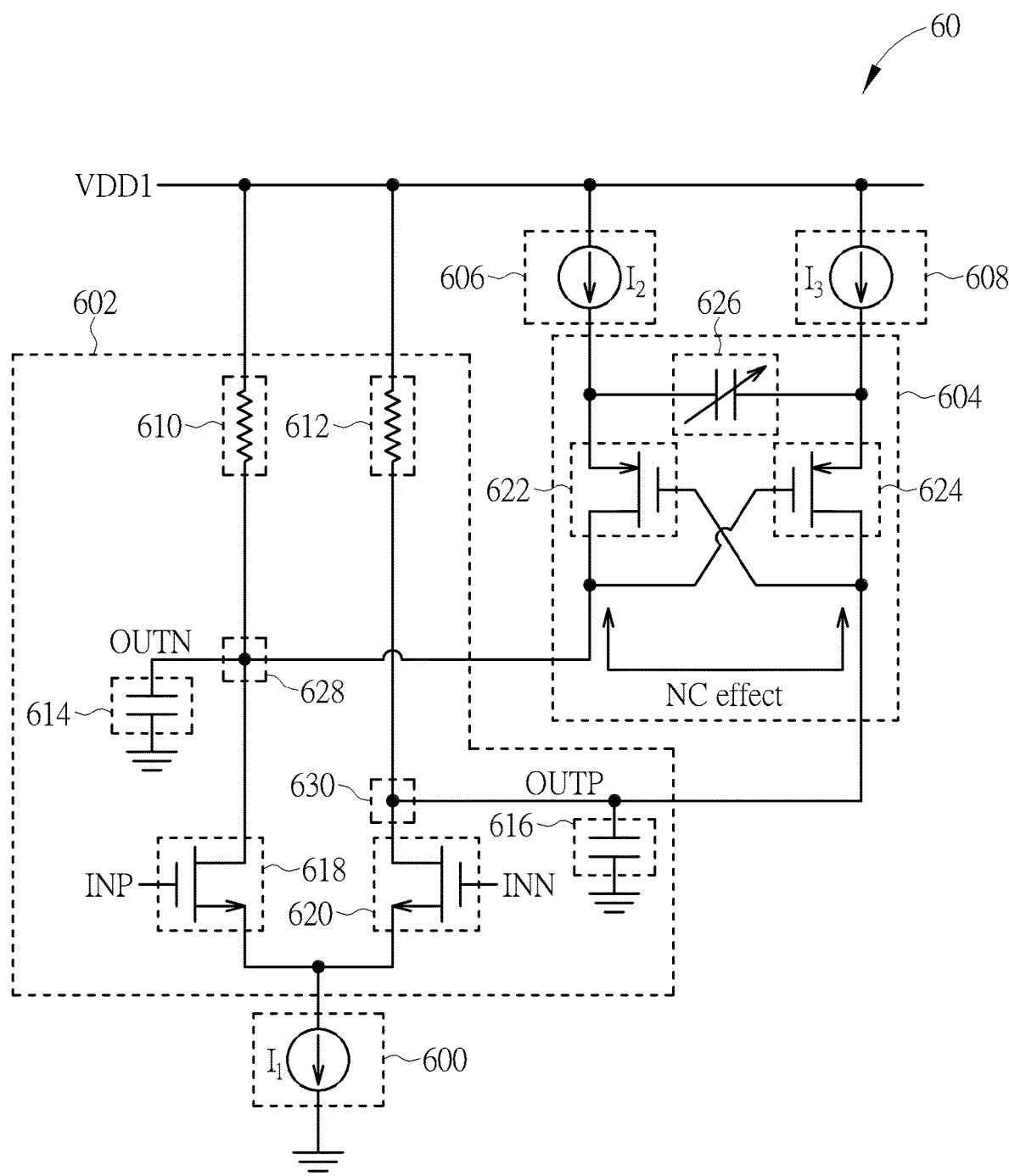
FIG. 6 is a diagram illustrating the negative impedance synthesis circuit shown in FIG. 5 according to an embodiment of the present invention.

FIG. 6 is a diagram illustrating the negative impedance synthesis circuit 50 shown in FIG. 5 according to an embodiment of the present invention. The negative impedance synthesis circuit 50 shown in FIG. 5 may be implemented by a negative impedance synthesis circuit 60 shown in FIG. 6 (i.e. the negative impedance synthesis circuit 60 also uses the architecture shown in FIG. 5). As shown in FIG. 6, the negative impedance synthesis circuit 60 may include a current source 600, a CML amplifier 602, and a negative impedance conversion circuit 604, wherein the current source 600 is arranged to realize the current source circuit 500 shown in FIG. 5, the CML amplifier 602 is arranged to realize the differential circuit 502 shown in FIG. 5, and the negative impedance conversion circuit 604 is arranged to realize the negative impedance conversion circuit 504 shown in FIG. 5.

In this embodiment, a terminal of the current source 600 (e.g. the current source circuit 500 shown in FIG. 5) may be connected to ground (e.g. the reference voltage V1 shown in FIG. 5 is equal to 0), another terminal of the current source 600 may be coupled to the CML amplifier 602 (e.g. the differential circuit 502 shown in FIG. 5), and the current source 600 may be arranged to provide a predetermined current $I_1$. The CML amplifier 602 may be coupled between the current source 600 and a power voltage VDD1 (e.g. the reference voltage V2 shown in FIG. 5), and may be arranged to receive a differential input pair (i.e. the differential input voltages INN and INP) and output a differential output pair (i.e. the differential output voltages OUTN and OUTP).

In addition, the CML amplifier 602 may include a plurality of parasitic capacitances 614 and 616, a plurality of N-type transistors 618 and 620, and a plurality of output terminals 628 and 630 (e.g. the output terminals 520 and 522 shown in FIG. 5), wherein the parasitic capacitance 614 may be located between the output terminal 628 and ground, the parasitic capacitance 616 may be located between the output terminal 630 and ground, the N-type transistor 618 may be coupled between the output terminal 628 and the current source 600, the N-type transistor 620 may be coupled between the output terminal 630 and the current source 600, and the output terminals 628 and 630 may be arranged to output the differential output pair (e.g. output the differential output voltages OUTN and OUTP, respectively).

The negative impedance conversion circuit 604 may be coupled between the output terminal 628, the output terminal 630, and the power voltage VDD1 (e.g. the reference voltage V2 shown in FIG. 5), and may include a plurality of P-type transistors 622 and 624 and a variable capacitor 626, wherein a drain terminal of the P-type transistor 622 may be coupled to the output terminal 628, a gate terminal of the P-type transistor 622 may be coupled to the output terminal 630, a drain terminal of the P-type transistor 624 may be coupled to the output terminal 630, a gate terminal of the P-type transistor 624 may be coupled to the output terminal 628 (i.e. the P-type transistors 622 and 624 are cross-coupled, which may be implemented by the negative impedance conversion circuit 200 shown in FIG. 2), and the variable capacitor 626 may be coupled between a source terminal of the P-type transistor 622 and a source terminal of the P-type transistor 624. The CML amplifier 602 may further include a plurality of resistors 610 and 612 (e.g. the loads 512 and 514 shown in FIG. 5), wherein the resistor 610 may be coupled between the output terminal 628 and the power voltage VDD1, the resistor 612 may be coupled between the output terminal 630 and the power voltage VDD1, the negative impedance conversion circuit 604 and the resistor 610 may be connected in parallel to the output terminal 628, and the negative impedance conversion circuit 604 and the resistor 612 may be connected in parallel to the output terminal 630.

It should be noted that the resistors 610 and 612 (e.g. the loads 512 and 514 shown in FIG. 5) of the CML amplifier 602 may be replaced with passive inductors, active inductors, or a plurality of inductors and resistors coupled in series, coupled in parallel, or a combination of series and parallel. The representation of the loads with resistors is only for illustrative purposes; the present invention is not limited thereto. In addition, there are a plurality of current sources 606 and 608 between the negative impedance conversion circuit 604 and the power voltage VDD1, for providing a current $I_2$ flowing through the P-type transistor 622 and a current $I_3$ flowing through the P-type transistor 624, respectively.

As shown in FIG. 6, the CML amplifier 602 and the negative impedance conversion circuit 604 may share the current source 600 (i.e. share the predetermined current $I_1$ provided by the current source 600). That is, the current $I_2$ and the current $I_3$ are a portion of the predetermined current $I_1$. As a result, when the negative impedance conversion circuit 604 achieves the negative capacitance effect (for brevity, labeled as "NC effect" in FIG. 6) by an equivalent impedance of the variable capacitor 626 at the output terminals 628 and 630, to compensate for the parasitic capacitances 614 and 616, the negative impedance conversion circuit 604 only needs to consume the portion of the predetermined current $I_1$ (i.e. the current $I_2$ and the current $I_3$), without consuming any additional current. In this way, the bandwidth of the negative impedance synthesis circuit 60 may be increased, and the power consumption and the cost of the negative impedance synthesis circuit 60 may be reduced. In addition, a capacitance value of the variable capacitor 626 may be adjusted to fine-tune the frequency response of the negative impedance synthesis circuit 60 at high frequencies.

Figure 7:
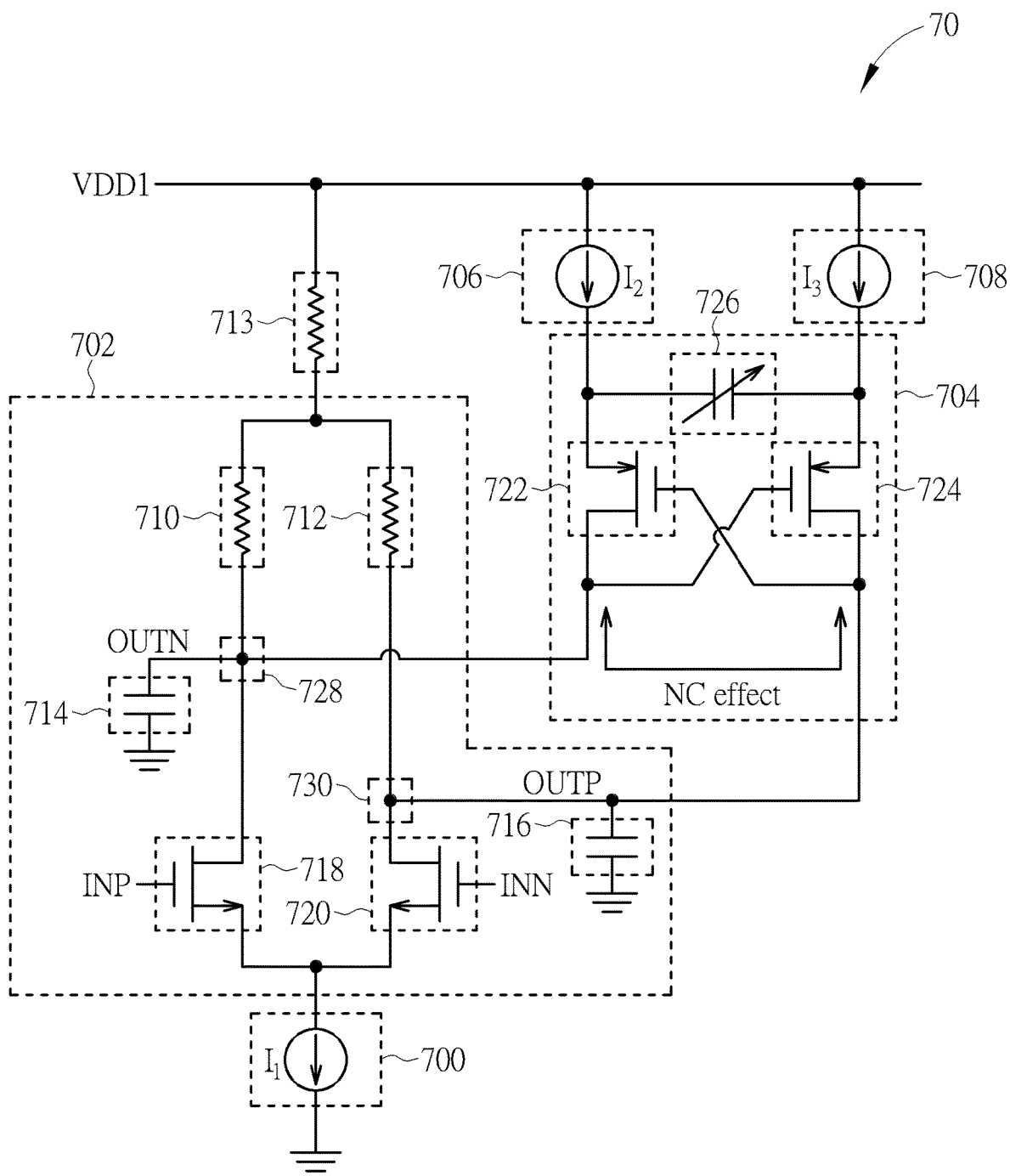
FIG. 7 is a diagram illustrating the negative impedance synthesis circuit shown in FIG. 5 according to another embodiment of the present invention.

FIG. 7 is a diagram illustrating the negative impedance synthesis circuit 50 shown in FIG. 5 according to another embodiment of the present invention. The negative impedance synthesis circuit 50 shown in FIG. 5 may be implemented by a negative impedance synthesis circuit 70 shown in FIG. 7 (i.e. the negative impedance synthesis circuit 70 also uses the architecture shown in FIG. 5). As shown in FIG. 7, the negative impedance synthesis circuit 70 may include a current source 700, a CML amplifier 702, and a negative impedance conversion circuit 704, wherein the current source 700 is arranged to realize the current source circuit 500 shown in FIG. 5, the CML amplifier 702 is arranged to realize the differential circuit 502 shown in FIG. 5, and the negative impedance conversion circuit 704 is arranged to realize the negative impedance conversion circuit 504 shown in FIG. 5.

In this embodiment, a terminal of the current source 700 (e.g. the current source circuit 500 shown in FIG. 5) may be connected to ground (e.g. the reference voltage V1 shown in FIG. 5 is equal to 0), another terminal of the current source 700 may be coupled to the CML amplifier 702 (e.g. the differential circuit 502 shown in FIG. 5), and the current source 700 may be arranged to provide a predetermined current $I_1$. The CML amplifier 702 may be coupled between the current source 700 and a power voltage VDD1 (e.g. the reference voltage V2 shown in FIG. 5), and may be arranged to receive a differential input pair (i.e. the differential input voltages INN and INP) and output a differential output pair (i.e. the differential output voltages OUTN and OUTP).

In addition, the CML amplifier 702 may include a plurality of parasitic capacitances 714 and 716, a plurality of N-type transistors 718 and 720, and a plurality of output terminals 728 and 730 (e.g. the output terminals 520 and 522 shown in FIG. 5), wherein the parasitic capacitance 714 may be located between the output terminal 728 and the ground, the parasitic capacitance 716 may be located between the output terminal 730 and the ground, the N-type transistor 718 may be coupled between the output terminal 728 and the current source 700, the N-type transistor 720 may be coupled between the output terminal 730 and the current source 700, and the output terminals 428 and 430 may be arranged to output the differential output pair (e.g. output the differential output voltages OUTN and OUTP, respectively).

The negative impedance conversion circuit 704 may be coupled between the output terminal 728, the output terminal 730, and the power voltage VDD1, and may include a plurality of P-type transistors 722 and 724 and a variable capacitor 726, wherein a drain terminal of the P-type transistor 722 may be coupled to the output terminal 728, a gate terminal of the P-type transistor 722 may be coupled to the output terminal 730, a drain terminal of the P-type transistor 724 may be coupled to the output terminal 730, a gate terminal of the P-type transistor 724 may be coupled to the output terminal 728 (i.e. the P-type transistors 722 and 724 are cross-coupled, which may be implemented by the negative impedance conversion circuit 200 shown in FIG. 2), and the variable capacitor 726 may be coupled between a source terminal of the P-type transistor 722 and a source terminal of the P-type transistor 724. The CML amplifier 702 may further include a plurality of resistors 710 and 712 (e.g. the loads 512 and 514 shown in FIG. 5), wherein the resistor 710 may be coupled between the output terminal 728 and the power voltage VDD1 (e.g. the reference voltage V2 shown in FIG. 5), the resistor 712 may be coupled between the output terminal 730 and the power voltage VDD1, the negative impedance conversion circuit 704 and the resistor 710 may be connected in parallel to the output terminal 728, and the negative impedance conversion circuit 704 and the resistor 712 may be connected in parallel to the output terminal 730.

It should be noted that the resistors 710 and 712 (e.g. the loads 512 and 514 shown in FIG. 5) of the CML amplifier 702 may be replaced with passive inductors, active inductors, or a plurality of inductors and resistors coupled in series, coupled in parallel, or a combination of series and parallel. The representation of the loads with resistors is only for illustrative purposes; the present invention is not limited thereto. In addition, there is a resistor 713 between the power voltage VDD1 and the CML amplifier 702, wherein the resistor 713 is arranged to divide the power voltage VDD1 into the CML amplifier 702 as another reference voltage. In this way, although the negative impedance synthesis circuit 70 has only one power voltage VDD1 (e.g. the reference voltage V2), the architecture of the impedance synthesis circuit 10 shown in FIG. 1 (i.e. two reference voltages) may be realized. Additionally, there are a plurality of current sources 706 and 708 between the negative impedance conversion circuit 704 and the power voltage VDD1, for providing a current $I_2$ flowing through the P-type transistor 722 and a current $I_3$ flowing through the P-type transistor 724, respectively.

As shown in FIG. 7, the CML amplifier 702 and the negative impedance conversion circuit 704 may share the current source 700 (i.e. share the predetermined current $I_1$ provided by the current source 700). That is, the current $I_2$ and the current $I_3$ are a portion of the predetermined current $I_1$. As a result, when the negative impedance conversion circuit 704 achieves the negative capacitance effect (for brevity, labeled as "NC effect" in FIG. 7) by an equivalent impedance of the variable capacitor 726 at the output terminals 728 and 730, to compensate for the parasitic capacitances 714 and 716, the negative impedance conversion circuit 704 only needs to consume the portion of the predetermined current $I_1$ (i.e. the current $I_2$ and the current $I_3$), without consuming any additional current. In this way, the bandwidth of the negative impedance synthesis circuit 70 may be increased, and the power consumption and the cost of the negative impedance synthesis circuit 70 may be reduced. In addition, a capacitance value of the variable capacitor 726 may be adjusted to fine-tune the frequency response of the negative impedance synthesis circuit 70 at high frequencies.

Please note that the circuits shown in FIG. 6 and FIG. 7 are for illustrative purposes only, and the present invention is not limited thereto. In practice, any negative impedance synthesis circuit that is realized based on the architecture shown in FIG. 5 will fall within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit for synthesizing a negative impedance, comprising:
    a current source circuit, arranged to provide at least one predetermined current, wherein the current source circuit has a first connection port and a second connection port, and the first connection port of the current source circuit is coupled to a first reference voltage;
    a differential circuit, coupled between the second connection port of the current source circuit and a second reference voltage, and arranged to receive a differential input pair and generate a differential output pair, wherein the differential circuit has a differential output port for outputting the differential output pair; and
    a negative impedance conversion circuit, coupled between the differential output port and a third reference voltage, wherein the third reference voltage is different from the first reference voltage;
    wherein the differential output port comprises a first output terminal and a second output terminal, and the differential circuit comprises:
        a first load, coupled between the first output terminal and the second reference voltage; and
        a second load, coupled between the second output terminal and the second reference voltage;
        wherein the negative impedance conversion circuit and the first load are connected in parallel to the first output terminal, and the negative impedance conversion circuit and the second load are connected in parallel to the second output terminal.

2. The circuit of claim 1, wherein the second reference voltage and the third reference voltage are higher than the first reference voltage.

3. The circuit of claim 1, wherein the third reference voltage is different from the second reference voltage.

4. The circuit of claim 3, wherein the third reference voltage is higher than the second reference voltage.

5. The circuit of claim 1, wherein the second reference voltage is equal to the third reference voltage.

6. The circuit of claim 1, wherein the negative impedance conversion circuit comprises:
    a first P-type transistor, wherein a drain terminal of the first P-type transistor is coupled to the first output terminal, and a gate terminal of the first P-type transistor is coupled to the second output terminal;
    a second P-type transistor, wherein a drain terminal of the second P-type transistor is coupled to the second output terminal, and a gate terminal of the second P-type transistor is coupled to the first output terminal; and
    a capacitor, coupled between a source terminal of the first P-type transistor and a source terminal of the second P-type transistor.

7. The circuit of claim 6, wherein the capacitor is a variable capacitor.

8. The circuit of claim 1, wherein the first load is one of a resistor, a passive inductor, an active inductor, and a plurality of inductors and resistors coupled in series, coupled in parallel, or a combination of series and parallel.

9. The circuit of claim 1, wherein the second load is one of a resistor, a passive inductor, an active inductor, and a plurality of inductors and resistors coupled in series, coupled in parallel, or a combination of series and parallel.

\* \* \* \* \*